United States Patent [19]

Daghighian

[11] Patent Number: 4,656,460
[45] Date of Patent: Apr. 7, 1987

[54] D/A CONVERTER

[75] Inventor: Hamid Daghighian, Geneva, Switzerland

[73] Assignee: Motorola, Inc., Schaumburg, Ill.

[21] Appl. No.: 866,837

[22] Filed: May 27, 1986

[30] Foreign Application Priority Data

Jun. 6, 1985 [GB] United Kingdom ............... 8514347

[51] Int. Cl.⁴ ............................................ H03M 1/82
[52] U.S. Cl. ............................... 340/347 DA; 318/599
[58] Field of Search ............... 340/347 DA; 318/559, 318/603; 375/22; 307/265; 329/106

[56] References Cited

U.S. PATENT DOCUMENTS 3,648,275  3/1972  Bower ..................... 340/347 DA
4,383,245  5/1983  Cooley .................... 340/347 DA

*Primary Examiner*—Charles D. Miller
*Attorney, Agent, or Firm*—Vincent B. Ingrassia

[57] ABSTRACT

A D/A/ converter for use in a microprocessor comprises first and second timers (3A, 3B), first and second modulus latches (2A, 2B) associated respectively with said first and second timers for holding respective digital values, the timers being arranged to produce first and second respective overflow signals (4A, 4B) at predetermined counts, wherein said second overflow signal (4B) causes said first and second timers (3A, 3B) to be reset to the digital values held in said respective latches (2A, 2B), and bistable means (6) for receiving said overflow signals and producing an output at a first level in response to said first overflow signal and at a second level in response to said second overflow signal, whereby the pulses so produced form a pulse width modulated signal whose duty cycle is representative of the ratio of said respective digital values held in said respective latches.

12 Claims, 2 Drawing Figures

D/A CONVERTER

This invention relates to D/A converters and more particularly to D/A converters of the type in which the digital signal is used to provide a pulse width modulated (p.w.m.) signal which is subsequently filtered to produce the analogue waveform.

It is an object of the present invention to produce the p.w.m. signal in a simple manner using existing parts of conventional microprocessors.

Accordingly, the invention provides a D/A converter for use in a microprocessor comprising first and second timers, first and second modulus latches associated respectively with said first and second timers for holding respective digital values, the timers being arranged to produce first and second respective overflow signals at predetermined counts, wherein said second overflow signal causes said first and second timers to be reset to the digital values held in said respective latches, and bistable means for receiving said overflow signals and producing an output at a first level in response to said first overflow signal and at a second level in response to said second overflow signal, whereby the pulses so produced form a pulse width modulated signal whose duty cycle is representative of the ratio of said respective digital values held in said respective latches.

The converter typically forms part of a microprocessor and usually further includes a filter, such as a capacitor, for filtering the p.w.m. signal to produce an analogue waveform.

The digital values held in the modulus latches are conveniently set by a microprocessing unit.

Preferably, the timers are also arranged to count down from the respective digital values and to produce their respective overflow signals when their count reaches zero.

In a preferred embodiment, said bistable means comprises a flip-flop which is toggled by said overflow signals. The bistable means may also comprise logic gate means for enabling the overflow signals to be passed to the flip-flop. The logic gate means preferably comprises two AND-gates, each gate having one input connected to receive an Enable signal and the other input connected to receive a respective one of said timer overflow signals, the outputs of the AND-gates being connected so as to toggle the flip-flop.

One embodiment of a D/A converter according to the invention will now be more fully described by way of example with reference to the drawings of which;

Figure 1:
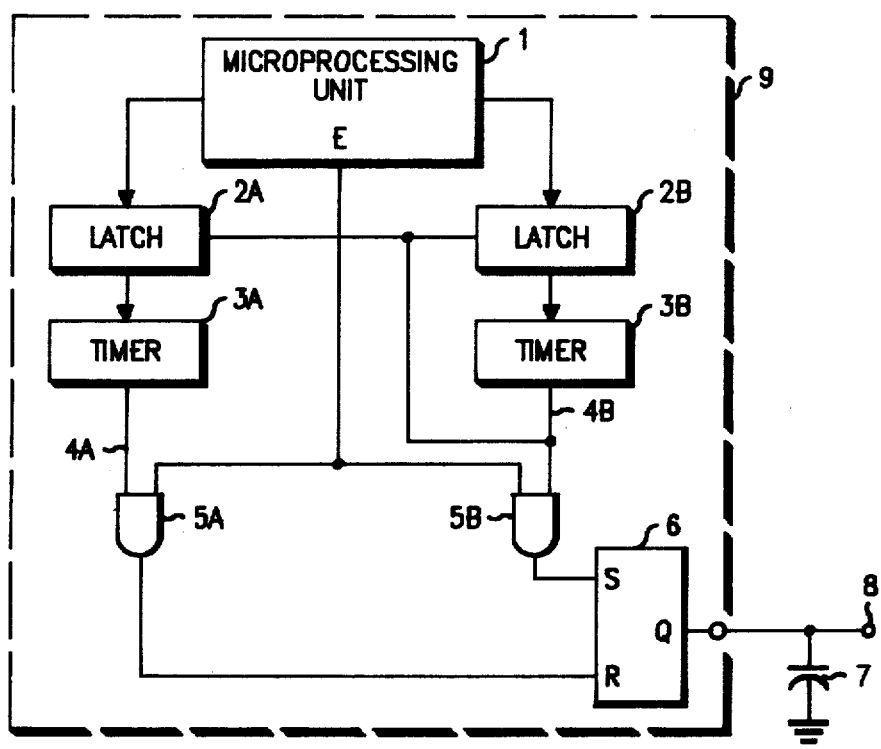
FIG. 1 is a block diagram of part of the D/A converter in a microprocessor.

Thus, as shown in FIG. 1 of the drawing, a microprocessor 9 includes microprocessing unit 1 which is used to provide digital values to each of two modulus latches 2A and 2B. Each latch 2A and 2B is connected to a respective timer 3A and 3B. The latches 2A and 2B are used to reset the timers 3A and 3B to the digital values provided by the microprocessing unit 1.

Each timer counts down from the reset value and provides an overflow signal, designated 4A and 4B respectively, when its count reaches zero. The overflow signal 4B from the timer 3B is used to cause both the latches 2A and 2B to reset their respective timers 3A and 3B to the digital values stored in the respective latches at that time.

Each of the overflow signals 4A and 4B is passed to an input of a respective AND-gate 5A and 5B. The other inputs of the AND-gates are connected in common to the microprocessing unit 1 which provides an Enable signal E to the gates.

The outputs from the gates 5A and 5B are then passed to the inputs R and S of a flip-flop 6 and are used to toggle the flip-flop to produce a pulse width modulated output at Q. This is then filtered by a low-pass filter in the form of a capacitor 7 to provide an analogue waveform at the output 8.

The operation of the D/A converter will now be more fully explained.

The digital value passed to the latch 2B by the microprocessing unit 1 is representative of the period of the desired waveform so that when the timer 3B counts down to zero and produces the overflow signal 4B, this defines the beginning of each period since the overflow signal also causes resetting of both timers to the values held in their respective modulus latches. The digital value in latch 2A represents the width of the pulse and consequently is smaller than the value in latch 2B. The timer 3A therefore produces an overflow signal 4A which defines the end of the pulse which started at the beginning of the period.

In order to produce the pulse width modulated signal, therefore, one of the overflow signals is used to toggle the flip-flop 6 into a high output and the other overflow signal toggles the flip-flop 6 into a low output. The output so produced is thus a train of pulses which is then filtered by the capacitor 7.

The invention thus utilises existing components of a microprocessor 9 to produce the p.w.m. signal.

It will be apparent that although in this embodiment a flip-flop has been used to provide the pulses, various other bistable devices could be used equally well.

Figure 2:
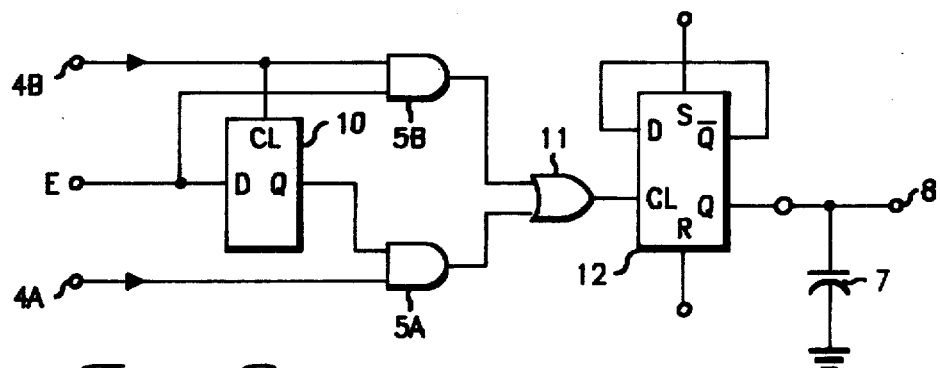
FIG. 2 is a block diagram of a second embodiment of a logic circuit forming part of the D/A converter.

For example, as shown in FIG. 2, two D-type flip-flops may be used as will be further described below. In this case the overflow signals 4A and 4B are again passed to respective AND-gates 5A and 5B, but in this embodiment the Enable signal E is passed to a first D-type flip-flop 10 which is clocked by the overflow signal 4B from the time 3B. The enable signal is also passed to the second input of AND-gate 5B, but AND-gate 5A has the output from the flip-flop 10 as its second input.

The outputs from the two AND/gates 5A and 5B are passed to an OR-gate 11 whose output provides the clock for a second D-type flip-flop 12. This flip-flop 12 provides the pulse width modulated signal at its output Q, which is then filtered by a low-pass filter in the form of a capacitor 7 to provide an analogue waveform at the output 8. In this embodiment, the inverse output Q of the second flip-flop 12 is connected to the D input of the flip-flop 12 so that each time the flip-flop 12 is clocked by the output of the OR-gate 11, the output Q is reversed. The R and S inputs of the flip-flop 12 are used to set and reset the values in the flip-flop so that the signal has the desired polarity.

It will be apparent that by passing the Enable signal to the first D-type flip-flop 10, and to the AND-gate 5B, and by using the overflow signal 4B to clock the D-type flip-flop 10, the circuit is arranged so that the first signal to be passed to the OR-gate 11 from the AND-gate after the Enable signal is switched on, is the overflow signal 4B and the last signal to be passed to the OR-gate after the Enable signal is switched off, is the overflow signal 4A.

It will, of course, be appreciated that the pulse width modulated signal from the outputs of either of the flip-flops 6 or 12 can be passed directly to, for example, a DC motor without the need for additional filtering.

What I claim is:

1. A D/A converter for use in a microprocessor, comprising first and second timers, first and second modulus latches associated respectively with said first and second timers for holding respective digital values, the timers being arranged to produce first and second respective overflow signals at predetermined counts, wherein said second overflow signal causes both said timers to be reset to the digital values held in said respective latches, and bistable means for receiving said overflow signals and for producing an output at a first level in response to said first overflow signal and at a second level in response to said second overflow signal, whereby the pulses so produced form a pulse width modulated signal whose duty cycle is representative of the ratio of said respective digital values held in said respective latches.

2. A D/A converter according to claim 1 further including a microprocessing unit for setting said respective digital values in said first and second modulus latches.

3. A D/A converter according to claim 1 wherein said timers are arranged to count down from the respective digital values and to produce their respective overflow signals when their count reaches zero.

4. A D/A converter according to claim 1 wherein said bistable means comprises a flip-flop whose output is toggled in response to said overflow signals.

5. A D/A converter according to claim 4 wherein said bistable means further comprises logic gate means for enabling the overflow signals to be passed to the flip-flop.

6. A D/A converter according to claim 5 wherein said logic gate means comprises two AND-gates connected so that their outputs directly toggle an R/S flip-flop whose output is the p.w.m. signal, each AND-gate having one input connected to an Enable signal.

7. A D/A converter according to claim 1 wherein said flip-flop is a first D-type flip-flop which is clocked by said overflow signals, the inverse output of the flip-flop being connected back to its input so that its output is reversed each time it is clocked to form the p.w.m. signal.

8. A D/A converter according to claim 7 wherein said logic gate means comprises two AND-gates whose outputs are passed to an OR-gate which provides the clock input to said first D-type flip-flop.

9. A D/A converter according to claim 8 further comprising a second D-type flip-flop whose input is an Enable signal and which is clocked by said second overflow signal, the output of the second D-type flip-flop being passed to input of the same AND-gate as the first overflow signal, and the Enable signal also being passed to the input of the same AND-gate as the second overflow signal.

10. A D/A converter according to claim 1 further including means for filtering said p.w.m. signal so as to produce an analogue waveform.

11. A D/A converter according to claim 10 wherein said filtering means comprises a capacitor.

12. A microprocessor incorporating a D/A converter according to claim 1.

* * * * *